United States Patent
Wang

(10) Patent No.: US 11,088,146 B2
(45) Date of Patent: Aug. 10, 2021

(54) THIN-FILM TRANSISTOR EMBEDDED DYNAMIC RANDOM-ACCESS MEMORY

(71) Applicant: INTEL CORPORATION, Santa Clara, CA (US)

(72) Inventor: Yih Wang, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/474,885

(22) PCT Filed: Apr. 4, 2017

(86) PCT No.: PCT/US2017/025880
§ 371 (c)(1),
(2) Date: Jun. 28, 2019

(87) PCT Pub. No.: WO2018/186835
PCT Pub. Date: Oct. 11, 2018

(65) Prior Publication Data
US 2019/0326299 A1  Oct. 24, 2019

(51) Int. Cl.
*H01L 27/108* (2006.01)

(52) U.S. Cl.
CPC .... *H01L 27/10855* (2013.01); *H01L 27/1087* (2013.01); *H01L 27/10808* (2013.01);
(Continued)

(58) Field of Classification Search
CPC .......... H01L 27/0688; H01L 27/10808; H01L 27/10855; H01L 27/10867; H01L 27/1087;
(Continued)

(56) References Cited

U.S. PATENT DOCUMENTS 6,143,601 A    11/2000  Sun
6,348,374 B1 *  2/2002  Athavale ......... H01L 27/10823
                                              257/E21.655
(Continued)

FOREIGN PATENT DOCUMENTS

KR    20140026894 A    3/2014
KR    20140113428 A    9/2014
(Continued)

OTHER PUBLICATIONS

International Search Report and Written Opinion received for PCT/US2017/025880, dated Dec. 28, 2017. 11 pages.
(Continued)

*Primary Examiner* — Moazzam Hossain
*Assistant Examiner* — Mohammad A Rahman
(74) *Attorney, Agent, or Firm* — Schwabe, Williamson & Wyatt, P.C.

(57) ABSTRACT

An embedded dynamic random-access memory cell includes a wordline to supply a gate signal, a selector thin-film transistor (TFT) above the wordline and that includes an active layer and is configured to control transfer of a memory state of the memory cell between a first region and a second region of the active layer in response to the gate signal, a bitline to transfer the memory state and coupled to and above the first region of the active layer, a storage node coupled to and above the second region of the active layer, and a metal-insulator-metal capacitor coupled to and above the storage node and configured to store the memory state. In an embodiment, the wordline is formed in a back end of line process for interconnecting logic devices formed in a front end of line process below the wordline, and the selector TFT is formed in a thin-film process.

20 Claims, 10 Drawing Sheets

(52) U.S. Cl.
CPC .. *H01L 27/10829* (2013.01); *H01L 27/10867* (2013.01); *H01L 27/10873* (2013.01); *H01L 27/10885* (2013.01); *H01L 27/10888* (2013.01); *H01L 27/10891* (2013.01); *H01L 27/10897* (2013.01)

(58) Field of Classification Search
CPC ......... H01L 27/10873; H01L 27/10885; H01L 27/10888; H01L 27/10891; H01L 27/10897; H01L 27/1214
See application file for complete search history.

(56) References Cited

U.S. PATENT DOCUMENTS

| | | | |
|---|---|---|---|
| 6,703,661 B2 * | 3/2004 | Wu | G11C 16/0491 |
| | | | 257/314 |
| 9,478,495 B1 | 10/2016 | Pachamuthu et al. | |
| 10,491,209 B2 * | 11/2019 | Dicicco | H03K 17/16 |
| 2002/0190294 A1 | 12/2002 | Iizuka et al. | |
| 2007/0235792 A1 | 10/2007 | Kwon et al. | |
| 2008/0079050 A1 | 4/2008 | Tzeng et al. | |
| 2012/0012897 A1 | 1/2012 | Besser et al. | |
| 2013/0146868 A1 | 6/2013 | Zan et al. | |
| 2016/0005692 A1 * | 1/2016 | Chandhok | H01L 21/7682 |
| | | | 257/751 |
| 2016/0043137 A1 | 2/2016 | Lu et al. | |
| 2018/0033478 A1 * | 2/2018 | Tanaka | G11C 11/4074 |
| 2019/0393224 A1 * | 12/2019 | Wang | H01L 27/1255 |

FOREIGN PATENT DOCUMENTS

| | | |
|---|---|---|
| WO | 2018186835 A1 | 10/2018 |
| WO | 2018186863 A1 | 10/2018 |

OTHER PUBLICATIONS

International Search Report and Written Opinion received for PCT/US2017/026300, dated Dec. 28, 2017. 14 pages.
International Preliminary Report on Patentability received for PCT/US2017/025880. dated Oct. 8, 2019. 7 pages.
International Preliminary Report on Patentability received for PCT/US2017/026300. dated Oct. 8, 2019. 10 pages.

* cited by examiner

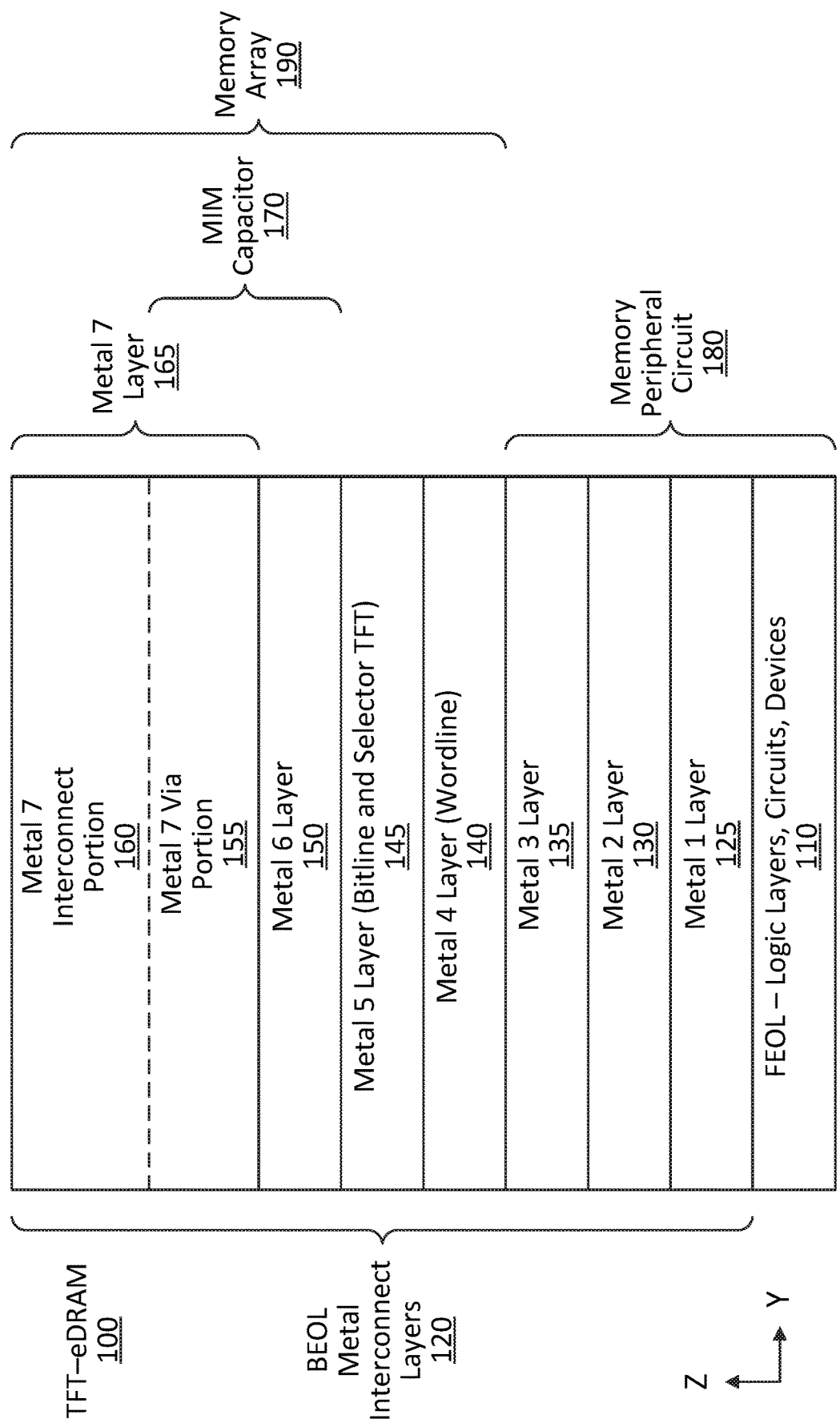

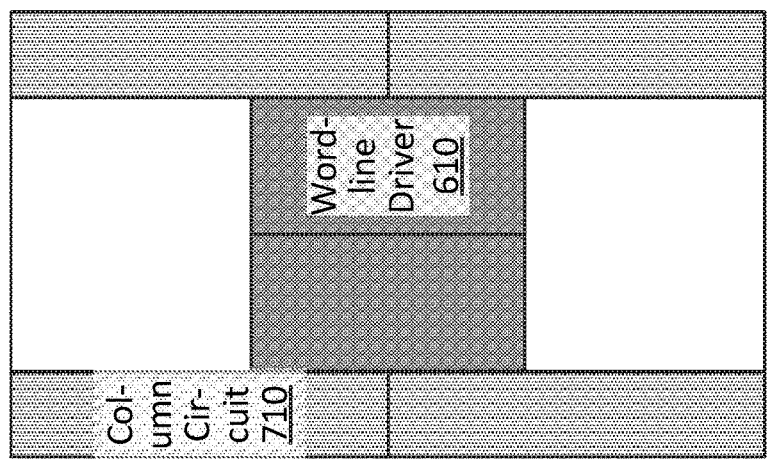
FIG. 7C
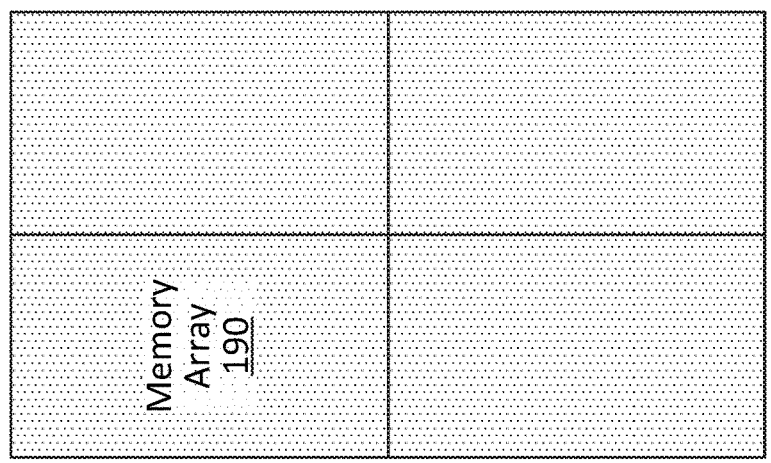
FIG. 7B
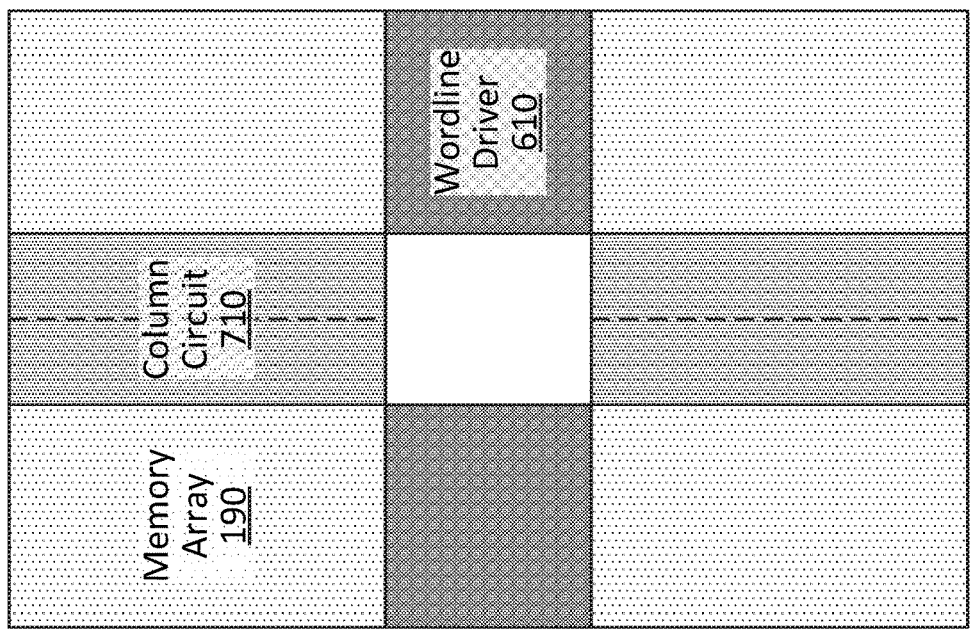
FIG. 7A
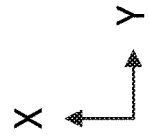

THIN-FILM TRANSISTOR EMBEDDED DYNAMIC RANDOM-ACCESS MEMORY

CROSS-REFERENCE TO RELATED APPLICATIONS

This patent application is a U.S. National Phase Application under 35 U.S.C. § 371 of International Application No. PCT/US2017/025880, filed on Apr. 4, 2017, the entire contents of which is hereby incorporated by reference herein.

BACKGROUND

Embedded memory is important to the performance of modern system on a chip (SoC) technology. Static random-access memory (SRAM) continues to be the embedded memory of choice for modern SoC due to its compatibility with the logic (e.g., front end of line, or FEOL) process. However, for applications demanding large on-die cache, such as tens of megabytes (MBs) for handling memory bandwidth, the area and standby power of a SRAM-based cache poses significant challenges to SoC design. Alternative higher-density embedded memory technology, such as dynamic random-access memory (DRAM) and in particular, embedded DRAM (eDRAM), has been introduced to address the limitation in density and standby power of a large SRAM-based cache.

BRIEF DESCRIPTION OF THE DRAWINGS

FIG. 1 is a cross-sectional view of an example thin-film transistor (TFT) based eDRAM (TFT-eDRAM), according to an embodiment of the present disclosure.

FIG. 7A is a plan view of an example layout of a TFT-eDRAM without overlap of the memory array and memory peripheral circuit.

FIGS. 7B-7C are plan views of an example layout of a TFT-eDRAM with overlap of the memory array and memory peripheral circuit, according to an embodiment of the present disclosure.

Figure 2A:
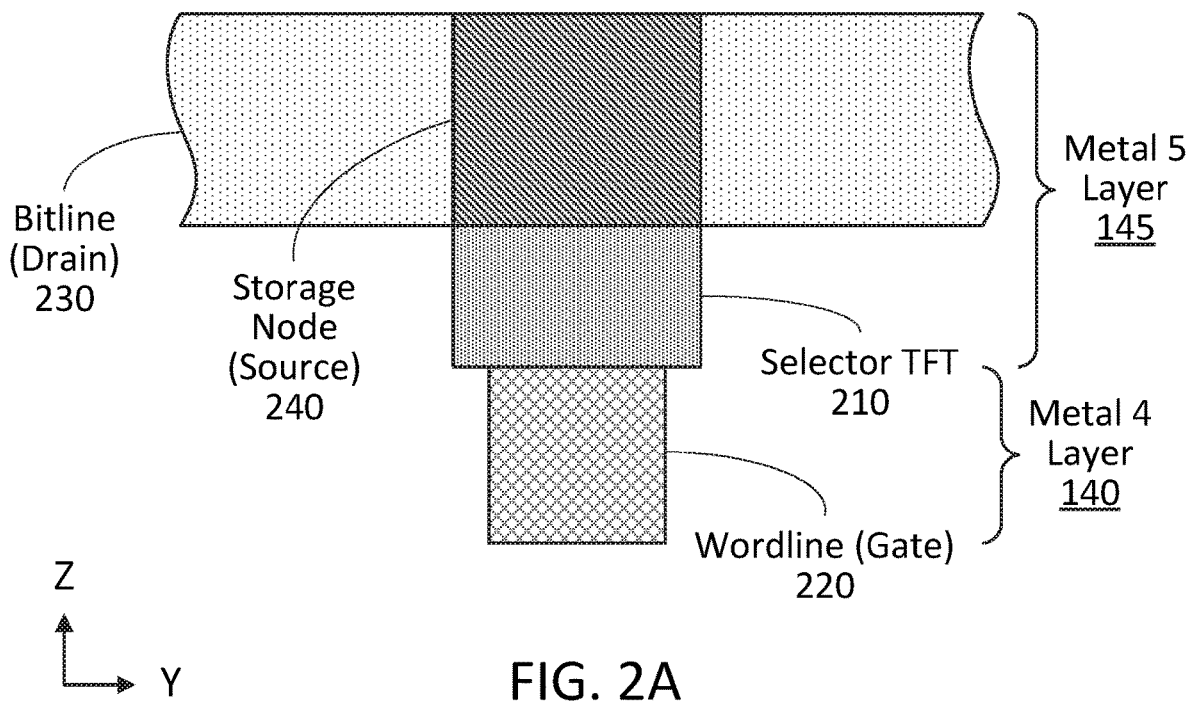
FIGS. 2A-2B are cross-sectional and plan views, respectively, of an example selector TFT in a TFT-eDRAM memory cell, according to an embodiment of the present disclosure.

These and other features of the present embodiments will be understood better by reading the following detailed description, taken together with the figures herein described. In the drawings, each identical or nearly identical component that is illustrated in various figures may be represented by a like numeral. For purposes of clarity, not every component may be labeled in every drawing. Furthermore, as will be appreciated, the figures are not necessarily drawn to scale or intended to limit the described embodiments to the specific configurations shown. For instance, while some figures generally indicate straight lines, right angles, and smooth surfaces, an actual implementation of the disclosed techniques may have less than perfect straight lines and right angles, and some features may have surface topography or otherwise be non-smooth, given real-world limitations of fabrication processes. In short, the figures are provided merely to show example structures.

DETAILED DESCRIPTION

An embedded dynamic random-access memory (eDRAM) memory cell is provided. In an embodiment, the eDRAM memory cell includes a wordline to supply a gate signal, a selector thin-film transistor (TFT), a bitline to transfer a memory state of the memory cell, a storage node, and a metal-in-metal (MIM) capacitor to store the memory state. The wordline can be formed, for example, in a back end of line (BEOL) process for interconnecting logic devices formed in a front end of line (FEOL) process below the wordline. The selector TFT includes an active layer and is configured to control transfer of the memory state between a first region and a second region of the active layer in response to the gate signal. The selector TFT is formed in a thin-film process above the wordline. The bitline is coupled to (and above) the first region of the active layer. The storage node is coupled to (and above) the second region of the active layer. The MIM capacitor is coupled to (and above) the storage node. In one or more further embodiments of the present disclosure, an eDRAM including these memory cells is provided.

The eDRAM includes wordlines and bitlines (crossing the wordlines) formed in a second part of the BEOL process, and wordline drivers and bitline drivers formed beneath the wordlines and bitlines in the FEOL process and a first part of the BEOL process. The memory cells are formed at crossing regions of the wordlines and bitlines, each memory cell corresponding to a different (wordline, bitline) pair.

General Overview

A standard eDRAM memory cell includes a capacitor for storing a bit (logical 1 or 0) and a selector transistor. Due to the leakage from the selector transistor, the capacitor is constantly refreshed to restore the voltage to an operational level. Accordingly, implementing eDRAM in an advanced technology node (e.g., 10 nanometer (nm), 7 nm, 5 nm, and beyond) can be challenging since it is difficult to reduce leakage of the logic-process-based select transistor in the scaled technology. Given the selector transistor leakage, the capacitance of the capacitor should be large enough that sufficient charge can be stored to meet the corresponding refresh times. However, given the smaller top area of a capacitor as memory array macro area decreases, this can lead to a taller capacitor to maintain the capacitor surface area and corresponding capacitance. This in turn creates a challenge for etching the capacitor trench as the process needs to support higher trench aspect ratio as the capacitor dimensions continue to scale.

Thus, and in accordance with an embodiment of the present disclosure, a low-leakage back end of line (BEOL) TFT based eDRAM is provided. The eDRAM may be used, for example, to address the scaling challenge of logic transistor (e.g., FEOL) based eDRAM technology and enable high density embedded memory in an advanced complementary metal-oxide-semiconductor (CMOS) process. In one or more embodiments of the present disclosure, the eDRAM bit cell uses a low-leakage selector TFT as the row selection transistor (row selector or selector transistor) and a MIM capacitor to store the data (one bit). By embedding the selector TFT in a higher metal layer and with a bottom gate design, the selector TFT is less susceptible to leakage than if it were formed in the FEOL portion of the integrated circuit. Since the eDRAM memory cell can be fabricated with only one transistor, eDRAM can provide higher density and lower standby power versus SRAM in the same process technology.

In further detail, according to an embodiment of the present disclosure, a low-leakage TFT based embedded DRAM (TFT-eDRAM) memory cell including one low-leakage selector TFT and one MIM capacitor is provided. The memory cell has characteristics such as the selector TFT being embedded in the BEOL layers of the CMOS process, the TFT having the gate below the thin film of the active semiconductor layer, and having source and drain contacts above the thin film layers, the MIM capacitor of the eDRAM memory cell being embedded in the BEOL layers above the TFT and connected to the drain terminal of the TFT, and the bitline of the TFT-eDRAM having a special metallization scheme to reduce bitline capacitance and improve the read sensing margin.

For example, in one or more embodiments of the present disclosure, the selector TFT, bitline (e.g., drain contact), storage node (e.g., source contact), and MIM capacitor and MIM capacitor plate (for coupling all of the top electrodes of the MIM capacitors to a common voltage source) structures are fabricated in the metal 5 layer through metal 7 layer using different fabrication stages than the metal 5 layer through metal 7 layer fabrication stages of other areas of the chip or integrated circuit (e.g., outside of the eDRAM). For instance, since the bitlines of the TFT-eDRAM can be fabricated in a separate operation (compared to the interconnect metals used in circuits outside of the TFT-eDRAM array), the dimensions and materials can be customized for lower bitline capacitance (e.g., between the bitline and the storage nodes), which improves read sensing margin of the TFT-eDRAM. The width and height of the bitline metal in the TFT-eDRAM (also the same material used for the storage nodes) can be reduced to lower bitline capacitance (e.g., with the storage nodes) compared to the width and height of metals used in circuits outside of the eDRAM array. Furthermore, with the TFT-eDRAM memory cell being embedded in the BEOL layers, the peripheral (or control) circuits of the memory array can be implemented under the eDRAM array and reduce the memory macro (X-Y) area substantially.

In contrast to other eDRAM approaches, one or more embodiments of the present disclosure provide for an eDRAM application that uses a low-leakage TFT for a selector transistor in a memory cell and that allows the eDRAM cell to use a MIM capacitor with lower capacitance and smaller aspect ratio while still meeting the same data retention requirements of other approaches. This alleviates the scaling challenge of a MIM capacitor. Further, other eDRAM cell approaches use a logic (e.g., FEOL) transistor as the selector transistor in the memory cell, for which MIM capacitors would have to be embedded in lower metal layers that are close to the selector transistor. Accordingly, as the pitches of lower metal layers aggressively scale in advanced technology nodes, embedding the MIM capacitors in the lower metal layers poses significant challenges to the scaling of eDRAM.

However, according to one or more embodiments of the present disclosure, with the selector transistor of the memory cell moved to the BEOL layers, the MIM capacitor can be implemented in the upper metal layers with correspondingly thicker inter-layer dielectric (ILD) and larger metal pitch to achieve higher capacitance. This eases the integration challenge introduced by embedding the MIM capacitors in the BEOL layers. In addition, according to one or more embodiments of the present disclosure, by embedding the transistor and the capacitor all in the upper metal layers, the peripheral circuits that control the memory operation can be hidden below the memory area to substantially reduce the memory macro array (e.g., X-Y area). Peripheral circuits of other eDRAM designs account for more than 35% of the total memory macro area, so moving the peripheral circuits below the memory array can substantially reduce the memory X-Y area.

Architecture and Methodology

FIG. 1 is a cross-sectional (Y-Z) view of an example TFT-eDRAM 100, according to an embodiment of the present disclosure. FIG. 1 illustrates the Y and Z dimensions (width and height, respectively), the X dimension (length) extending into and out of the Y-Z plane. The TFT-eDRAM 100 includes an FEOL 110 that includes most of the various logic layers, circuits, and devices to drive and control the integrated circuit (e.g., chip) being fabricated with the TFT-eDRAM 100. As illustrated in FIG. 1, the TFT-eDRAM 100 also includes a BEOL 120 including, in this case, seven metal interconnection layers (namely, metal 1 layer 125, metal 2 layer 130, metal 3 layer 135, metal 4 layer 140, metal 5 layer 145, metal 6 layer 150, and metal 7 layer 165, including metal 7 via portion 155 and metal 7 interconnect portion 160) to interconnect the various inputs and outputs of the FEOL 110.

Generally speaking, and specifically illustrated for the metal 7 layer 165, each of the metal 1 layer 125 through the metal 7 layer 165 includes a via portion and an interconnect portion located above the via portion, the interconnect portion for transferring signals along metal lines extending in the X or Y directions, the via portion for transferring signals through metal vias extending in the Z direction (such as to the next lower metal layer underneath). Accordingly, vias connect metal structures (e.g., metal lines or vias) from one metal layer to metal structures of the next lower metal layer. Further, each of the metal 1 layer 125 through the metal 7 layer 165 includes a pattern of conductive metal, such as copper (Cu) or aluminum (Al), formed in a dielectric medium or ILD (such as by photolithography).

In addition, the TFT-eDRAM 100 is further divided into a memory array 190 (e.g., an eDRAM memory array) built in the metal 4 layer 140 through the metal 7 layer 165 and including the low-leakage selector TFTs (in the metal 5 layer 145) and MIM capacitors 170 (in the metal 6 layer 150 and metal 7 layer via portion 155) as well as the wordlines (e.g., row selectors, in the metal 4 layer 140) and the bitlines (e.g., column selectors, in the metal 5 layer 145) making up the eDRAM memory cells, and a memory peripheral circuit 180 built in the FEOL and metal 1 layer 125 through metal 3 layer 135 to control (e.g., access, store, refresh) the memory array 190.

Compared to other eDRAM designs that locate such a memory control circuit in the same layers as the memory array but in a different macro (or X-Y) area of the integrated circuit than the memory array (such as at a periphery of the memory array), the TFT-eDRAM 100 locates the memory peripheral circuit 180 below the memory array 190 (e.g., in the same X-Y area), This saves valuable X-Y area in the finished integrated circuit. In further detail, the TFT-eDRAM 100 embeds the low-leakage selector TFTs in the metal 5 layer 145 (such as the via portion of the metal 5 layer 145). For example, the metal 4 layer 140 can contain the wordlines extending in the X direction to select a row of memory cells (bits) while the metal 5 layer 145 can contain the bitlines extending in the Y direction to sense each of the memory cells (bits) in the selected row (and to write memory data to any of the memory cells in the selected row). The selector TFTs can be fabricated in the metal 5 layer 145, above the wordlines (that serve as or connect to the gate electrodes or contacts) and below the bitlines (that serve as the drain electrodes or contacts). For example, the selector TFT can have the transistor gate below the thin film layer (that can be formed at the bottom of the metal 5 layer 145, such as in the via portion) and source and drain contacts above the thin film layer.

In further detail, the metal gate of the selector TFT in each memory cell is connected to a continuous metal 4 line below, such as a copper (Cu)-based metal line, which provides much lower resistance compared to gate lines formed in the lower (e.g., FEOL) portions of the integrated circuit. The continuous metal 4 line is used as the wordline of the memory array, and is covered by diffusion barriers or diffusion barrier layers including dielectric layers, such as silicon nitride (e.g., $Si_3N_4$), silicon carbide (e.g., SiC), or the like, with vias filled with metal-diffusion barrier films like tantalum nitride (TaN), tantalum (Ta), titanium zirconium nitride (e.g., $Ti_XZr_{1-X}N$, such as X=0.53), titanium nitride (e.g., TiN), titanium tungsten (TiW), or the like. A metal gate layer covers the diffusion barrier film-filled vias, which electrically connect the copper (Cu) wordline to the metal gates of the selector TFTs, the diffusion barrier film preventing or helping to prevent the diffusion or migration of copper (Cu) from the wordline to the rest of the selector TFTs. An active thin-film layer (e.g., indium gallium zinc oxide, or IGZO) and then source and drain contacts above the thin film layer use the metal 5 layer 145. The space between the source and drain contacts determines the gate length of the selector transistor. A three dimensional MIM capacitor 170 is embedded in the metal 6 layer 150 and via portion 155 of the metal 7 layer 165 (below the metal 7 interconnect portion 160).

Figure 2B:
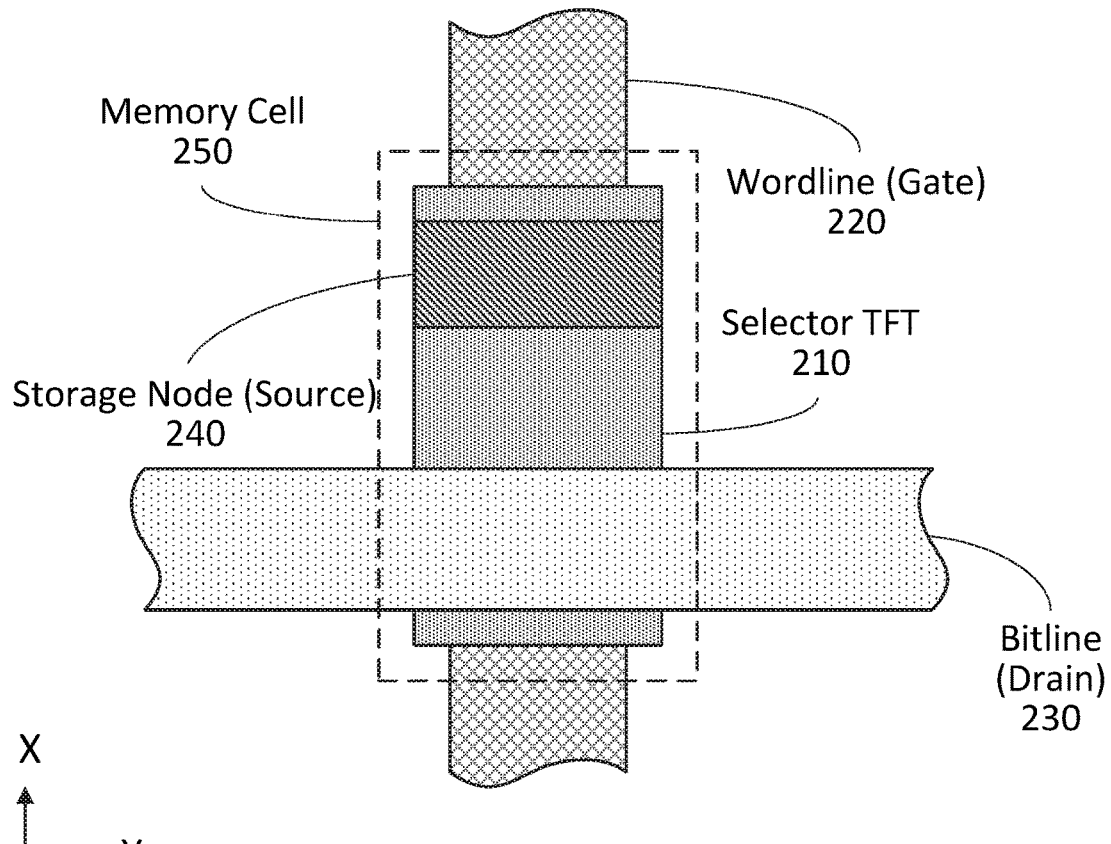
Figure 3A:
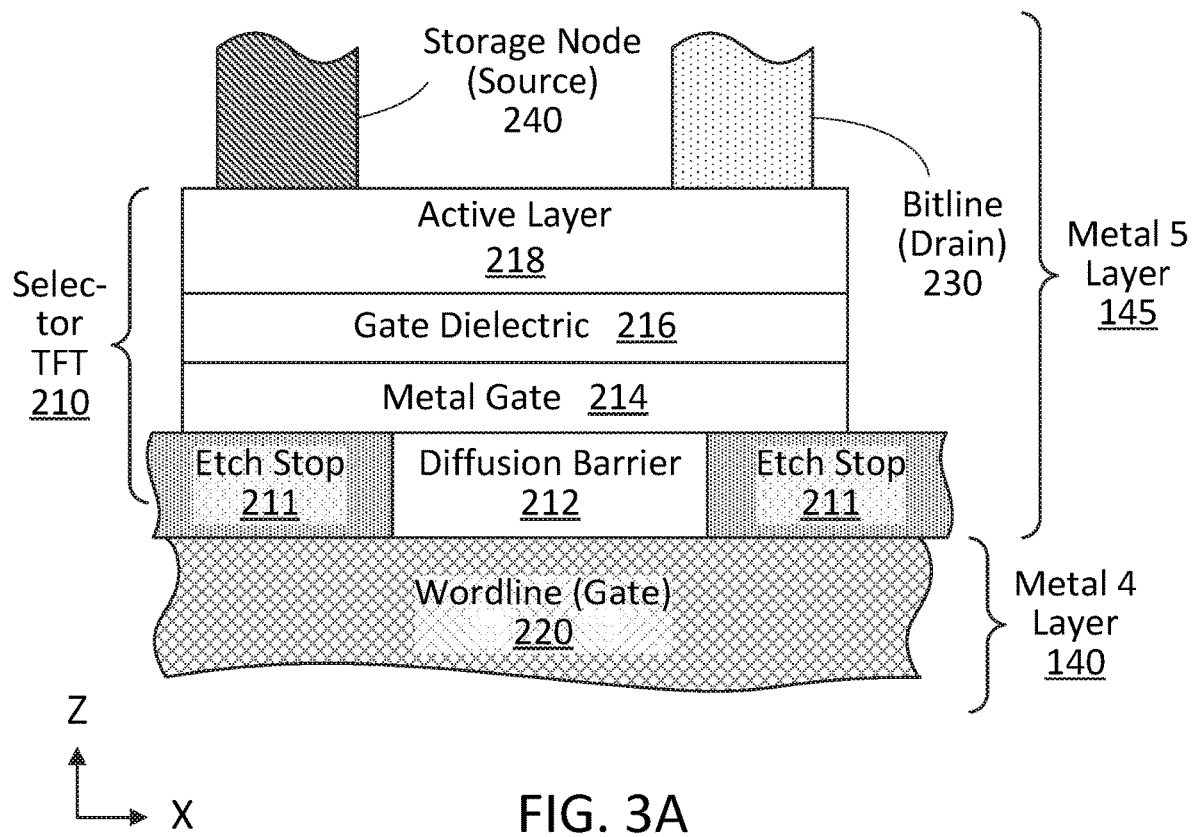
FIGS. 3A-3B are cross-sectional views of an example structure of the selector TFT in the TFT-eDRAM memory cell of FIGS. 2A-2B, according to an embodiment of the present disclosure.
Figure 3B:
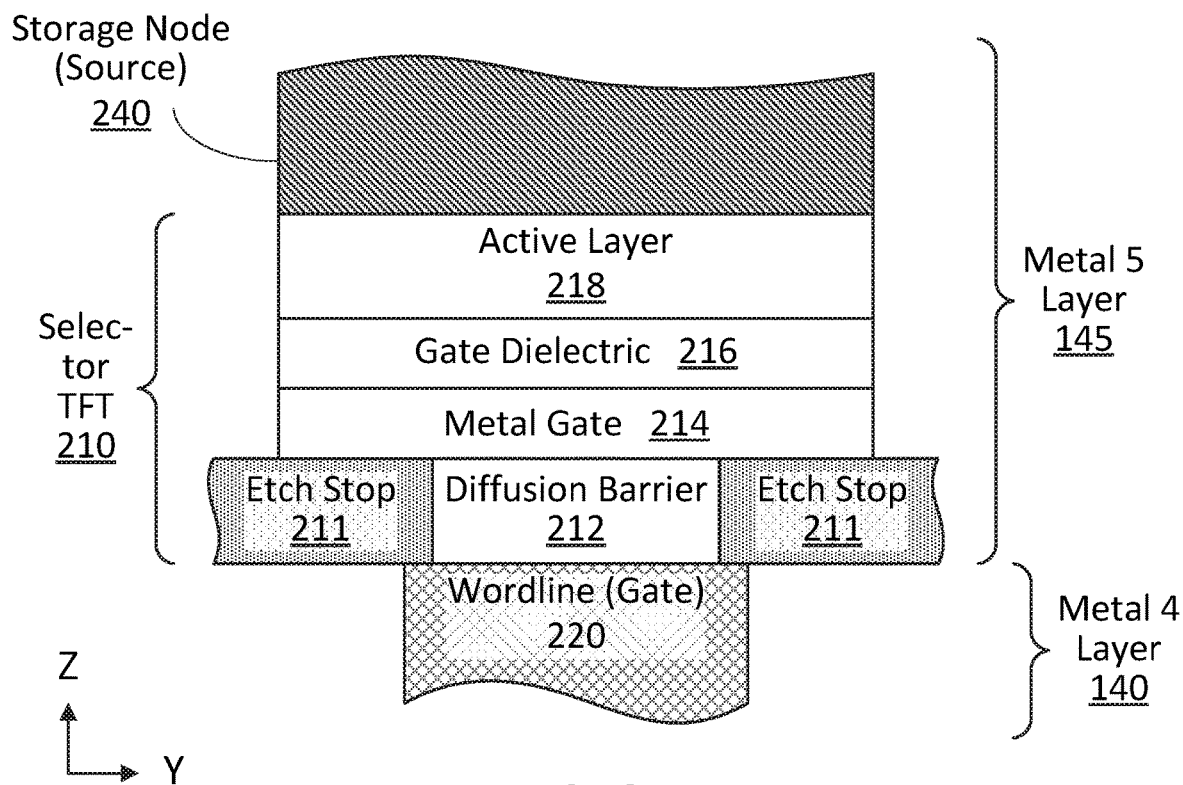

FIGS. 2A-2B are cross-sectional (Y-Z) and plan (Y-X) views, respectively, of an example selector TFT 210 in a TFT-eDRAM memory cell 250, according to an embodiment of the present disclosure. FIGS. 3A-3B are cross-sectional (X-Z and Y-Z, respectively) views of an example structure of the selector TFT 210 in the TFT-eDRAM memory cell 250 of FIGS. 2A-2B, according to an embodiment of the present disclosure.

The selector TFT 210 in the memory cell 250 is coupled to or controlled by wordline 220 (which serves as the gate), bitline 230 (which serves as the drain contact), and storage node 240 (which serves as the source contact). In the example embodiment of FIGS. 2A-2B, the wordline 220 is formed in the metal 4 layer 140 (such as with the same process used to fabricate the metal 4 layer 140 for the rest of the integrated circuit), the selector TFT 210 is formed in the metal 5 layer 145 (for instance, in the via portion of the metal 5 layer 145), and the storage node 240 and bitline 230 are formed in the metal 5 layer 145 (for instance, in the interconnect portion of the metal 5 layer 145), the metal 5 layer 145 and above fabrication being customized for the TFT-eDRAM (versus the fabrication of the metal 5 layer 145 and above done outside of the eDRAM) to account for the specialized structures in the eDRAM.

For instance, the metal 5 layer 145 for the TFT-eDRAM may use a different metal, such as titanium nitride (e.g., TiN) or tungsten (W), than the rest of the metal 5 layer 145 outside of the TFT-eDRAM. In some embodiments, the same metal (e.g., copper) is used for the metal 5 layer 145 for both inside the TFT-eDRAM and outside the TFT-eDRAM. Regardless of the choice of metal for the storage node 240 and bitline 230, the height (and width) of these structures can be further modified from those of the rest of the metal 5 layer 145, for example, to reduce capacitance of the bitline 230 with the storage nodes 240. These bitlines 230 can be connected to the sense amplifiers and other bitline drivers below the TFT-eDRAM memory array (e.g., below the metal 4 layer 140) by first coupling the bitlines 230 through the metal 6 layer 150 (e.g., copper interconnect) in an area outside the TFT-eDRAM process, where the bitline signals can be routed through via portions of the metal 5 layer 145, metal 4 layer 140, metal 3 layer 135, and further below if needed.

In the example embodiment of FIGS. 3A-3B, the bottom gate selector TFT 210 may include thin-film layers such as one or more gate electrode layers (e.g., diffusion barrier 212 and metal gate 214), a gate dielectric layer (e.g., gate dielectric 216), and a semiconductor (active) layer (e.g., active layer 218). The diffusion barrier 212 can be a metal- or copper-diffusion barrier (e.g., a conductive material to reduce or prevent the diffusion of metal or copper from wordline 220 into the metal gate 214 while still maintaining an electrical connection between the wordline 220 and the metal gate 214) on the wordline 220 such as tantalum nitride (TaN), tantalum (Ta), titanium zirconium nitride (e.g., $Ti_XZr_{1-X}N$, such as X=0.53), titanium nitride (e.g., TiN), titanium tungsten (TiW), combination (such as a stack structure of TaN on Ta), or the like.

For instance, the diffusion barrier 212 can include a single- or multi-layer structure including a compound of tantalum(Ta) and nitrogen(n), such as TaN or a layer of TaN on a layer of Ta. In some embodiments, a layer of etch resistant material (e.g., etch stop 211) such as silicon nitride (e.g., $Si_3N_4$) or silicon carbide (e.g., SiC) is formed over the wordline 220 with vias for a metal (or copper) diffusion barrier film 212 such as TaN or a TaN/Ta stack. The metal gate 214 can be a conductive material on the diffusion barrier 212, such as metal, conductive metal oxide or nitride, or the like. For example, in one embodiment, the metal gate 214 is titanium nitride (TiN). In another embodiment, the metal gate 214 is tungsten (W).

The gate dielectric 216 can be silicon dioxide ($SiO_2$), silicon nitride (e.g., $Si_3N_4$), hafnium dioxide ($HfO_2$) or other high-κ material, or a multi-layer stack including a first layer of $SiO_2$ and a second layer of a high-κ dielectric such as $HfO_2$ on the $SiO_2$. Any number of gate dielectrics can be used, as will be appreciated in light of the present disclosure. For example, in one embodiment, the gate dielectric 216 is a layer of $SiO_2$. In another embodiment, the gate dielectric 216 is a stack (e.g., two or more layers) of $HfO_2$ on $SiO_2$.

The active layer 218 can be IGZO or the like in contact with the bitline 230 (e.g., at a first region of the active layer 218, such as a drain region) and the storage node 240 (e.g., at a second region of the active layer 218, such as a source region, with a semi-conductive channel region between the first region and the second region). Such an active layer 218 channel may include only majority carriers in the thin film. Accordingly, the active layer 218 channel may require high bias (as supplied by the wordline 220, diffusion barrier film 212, and metal gate 214) to activate. In addition to IGZO, in some embodiments, the active layer is one of a variety of polycrystalline semiconductors, including, for example, zinc oxynitride (ZnON, such as a composite of zinc oxide (ZnO) and zinc nitride ($Zn_3N_2$), or of ZnO, $ZnO_xZ_y$, and $Zn_3N_2$), indium tin oxide (ITO), tin oxide (e.g., SnO), copper oxide (e.g., $Cu_2O$), polycrystalline germanium (poly-Ge) silicon-germanium (e.g., SiGe, such as $Si_{1-x}Ge_x$) structures (such as a stack of poly-Ge over SiGe), and the like.

Figure 4A:
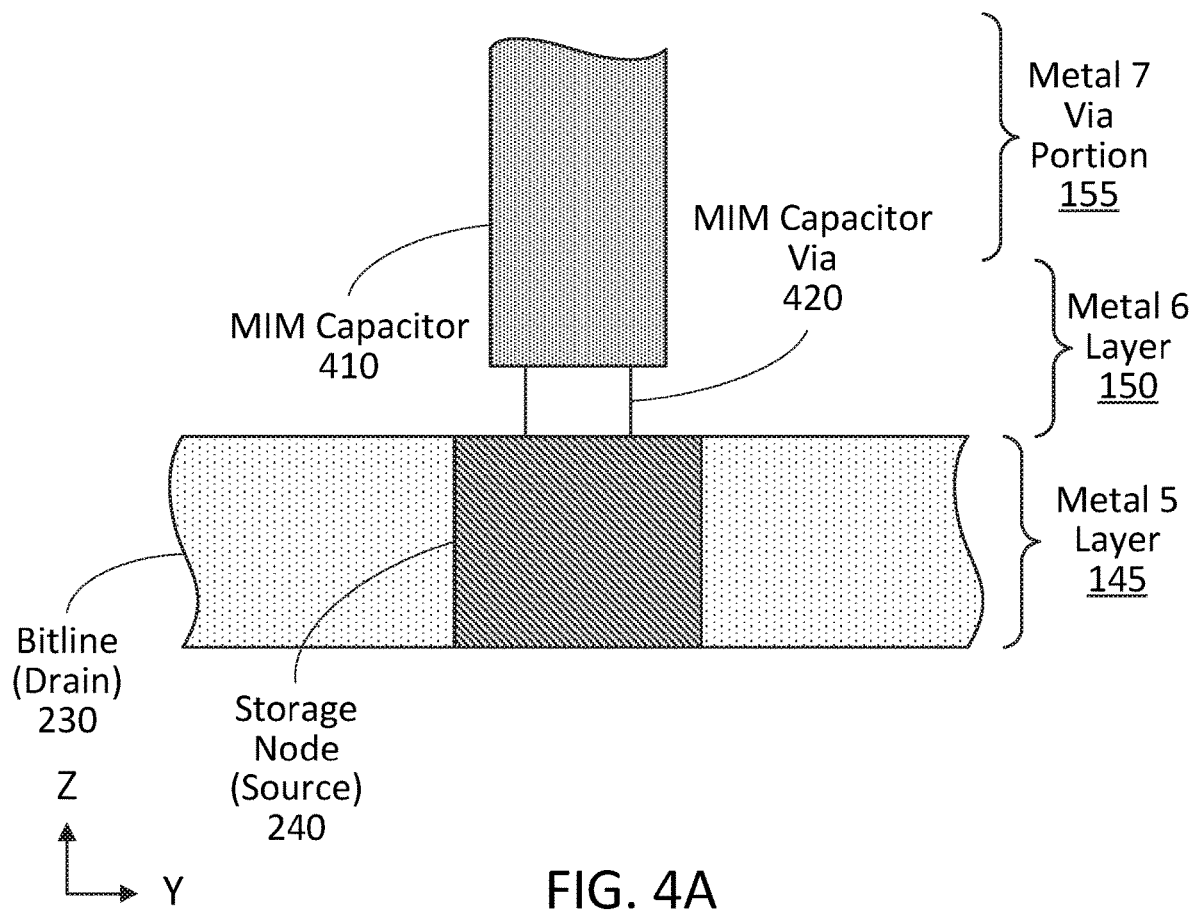
FIGS. 4A-4B are cross-sectional and plan views, respectively, of an example MIM capacitor in the TFT-eDRAM memory cell of FIGS. 2A-2B, according to an embodiment of the present disclosure.
Figure 4B:
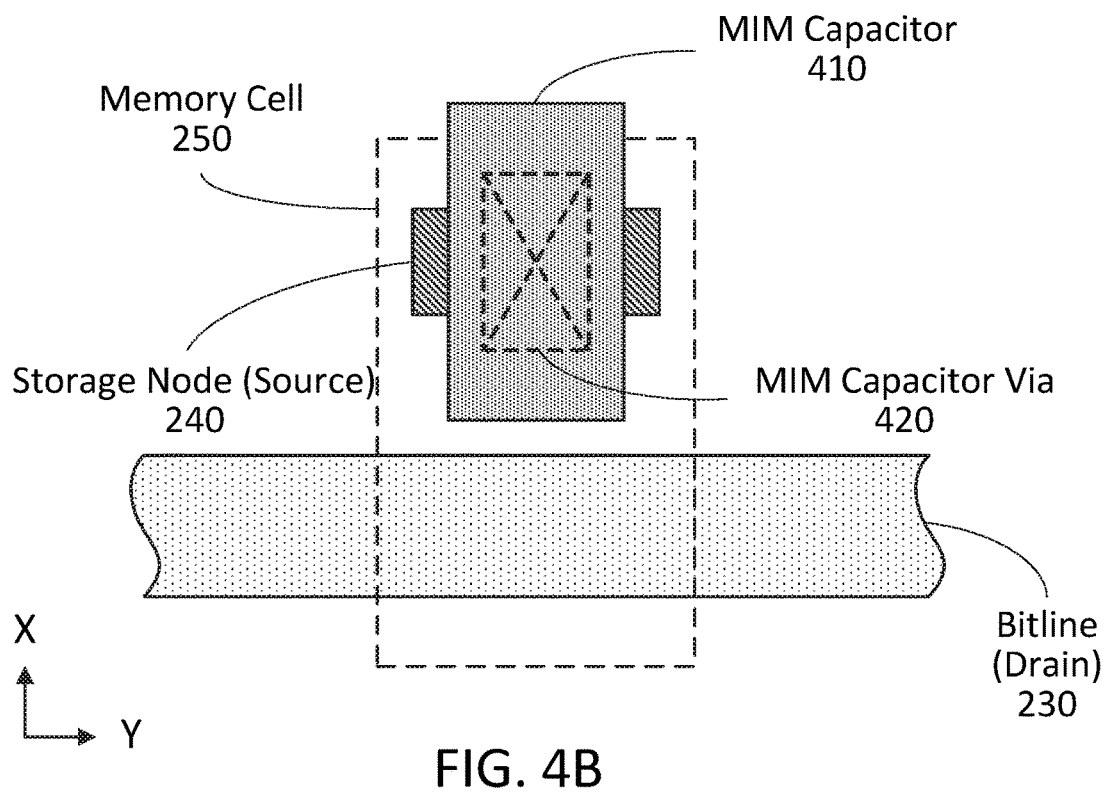
Figure 5:
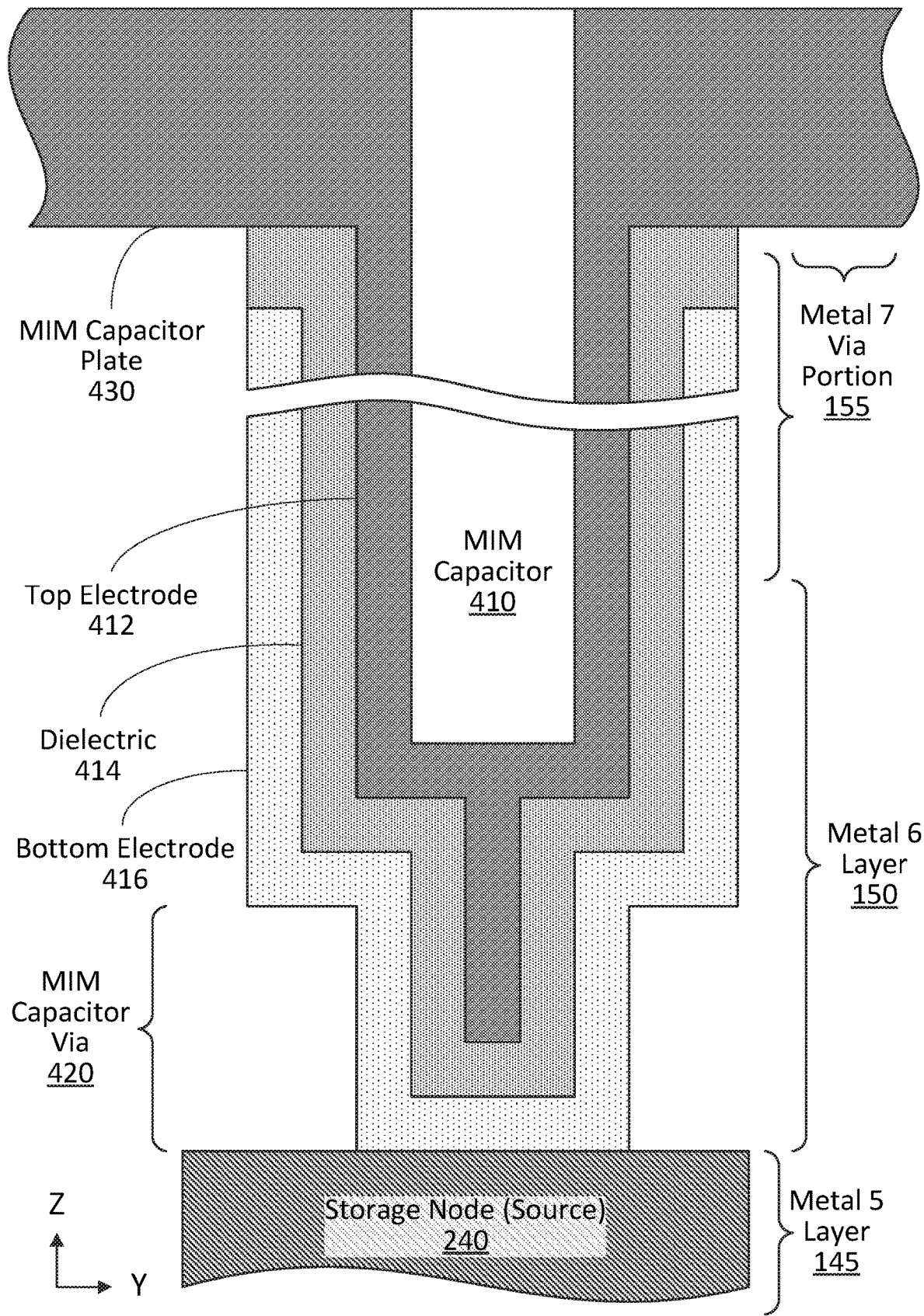
FIG. 5 is a cross-sectional view of an example structure of the MIM capacitor in the TFT-eDRAM memory cell of FIGS. 4A-4B, according to an embodiment of the present disclosure.

FIGS. 4A-4B are cross-sectional (Y-Z) and plan Y-X) views, respectively, of an example MIM capacitor 410 in the TFT-eDRAM memory cell 250 of FIGS. 2A-2B, according to an embodiment of the present disclosure. FIG. 5 is a cross-sectional (Y-Z) view of an example structure of the MIM capacitor 410 in the TFT-eDRAM memory cell 250 of FIGS. 4A-4B, according to an embodiment of the present disclosure.

The storage nodes 240 (source contacts) of the selector TFTs 210 in the memory cells 250 are separated between cells 250. Each storage node 240 is connected to a MIM capacitor 410 above through the MIM capacitor via 420. For example, the MIM capacitor via 420 may be fabricated in the via portion of the metal 6 layer 150 while the MIM capacitor 410 may be fabricated in the interconnect portion of the metal 6 layer 150 and the via portion 155 of the metal 7 layer 165. The MIM capacitor 410 may be fabricated by etching (for example, by photolithography) deep, narrow trenches in the upper portion of the metal 6 layer 150 and the via portion 155 of the metal 7 layer 165, and lining the trenches with a thin conductor (such as bottom electrode 416), a thin insulator (such as dielectric 414), and another thin conductor (such as top electrode 412), the thin insulator insulating one thin conductor from the other thin conductor. The MIM capacitor 410 is fabricated in a separate process from the rest of the metal 6 layer and metal 7 layer fabrication (to account for its large height and different electrode material from the rest of the metal 6 layer and metal 7 layer. This creates a relatively large capacitance in the MIM capacitor 410 by having a relatively large surface area for the terminals (e.g., top and bottom electrodes 412 and 416) separated by a relatively small amount of insulation (e.g., dielectric 414).

In further detail, in one or more embodiments of the present disclosure, the MIM capacitor 410 is formed by etching a trench in the metal 6 layer (e.g., interconnect portion) and metal 7 layer (e.g., via portion), and successively filling the trench with the three layers by, for example, atomic level deposition (ALD). For instance, the bottom electrode 416 can be filled to a thickness of 20-40 nm using a conductive material (e.g., metal, conductive metal nitride or carbide, or the like), followed by a thin dielectric 414 (to increase capacitance, for example, 20-40 nm), followed by a top electrode 412 again, using metal (such as 20-40 nm thick), which can be coupled to the top electrode of every other MIM capacitor 410 (e.g., in an array of eDRAM memory cells). The MIM capacitor 410 can be at least 300 nm in some embodiments (e.g., for metal 5 layers on the order of 140 nm), to provide sufficient capacitance.

For example, in one embodiment, the bottom electrode 416 is tantalum (Ta). In another embodiment, the bottom electrode 416 is titanium nitride (TiN). In some embodiments, the bottom electrode 416 is titanium aluminum nitride (e.g., TiAlN, where the molar amount of titanium is at least that of aluminum). In another embodiment, the bottom electrode 416 is tantalum aluminum carbide (TaAlC). In another embodiment, the bottom electrode 416 is tantalum nitride (TaN). For example, in one embodiment, the top electrode 412 is TiN. For example, in one embodiment, the dielectric 414 is $SiO_2$. In some embodiments, such as to reduce tunneling (e.g., when the dielectric 414 is very thin), the dielectric 414 is a high-κ dielectric material such as zirconium dioxide ($ZrO_2$) or aluminum oxide ($Al_2O_3$).

Each bottom electrode 416 of the MIM capacitor 410 connects to a corresponding storage node 240 through the MIM capacitor via 420. The bottom electrodes 416 of the MIM capacitors 410 are electrically insulated from each other while the top electrodes 412 of the MIM capacitors 410 are electrically connected to each other through a (shared) MIM capacitor plate 430 at the top of the MIM capacitors 410 and also located in the via portion 155 of the metal 7 layer 165. There may be separate MIM capacitor plates 430 for separate arrays of MIM capacitors 410. The MIM capacitor plate 430 may be coupled to a common voltage line (for example in the interconnect portion 160 of the metal 7 layer 165) to supply a common voltage to all of the top electrodes 412 through the MIM capacitor plate 430.

The drain contact of the selector TFT 210 is continuous and is used as the bitline 230 of the memory array 190. The heights of the source and drain contacts can be optimized to reduce bitline 230 capacitance (e.g., between the source and drain contacts) for better sensing margins. The drain contacts of the selector TFTs also serves as the bitlines 230 of the TFT-eDRAM array. The dimensions of the drain contacts (bitlines 230) can be customized for lower inter-metal capacitance (e.g., by using a separate fabrication stage to form the bitlines 230 versus the fabrication stage for this metal level in areas of the integrated circuit outside of the TFT-eDRAM array). Each MIM capacitor 410 connects to a source contact (e.g., storage node 240) of the selector TFT 210 through the MIM capacitor via 420.

Figure 6:
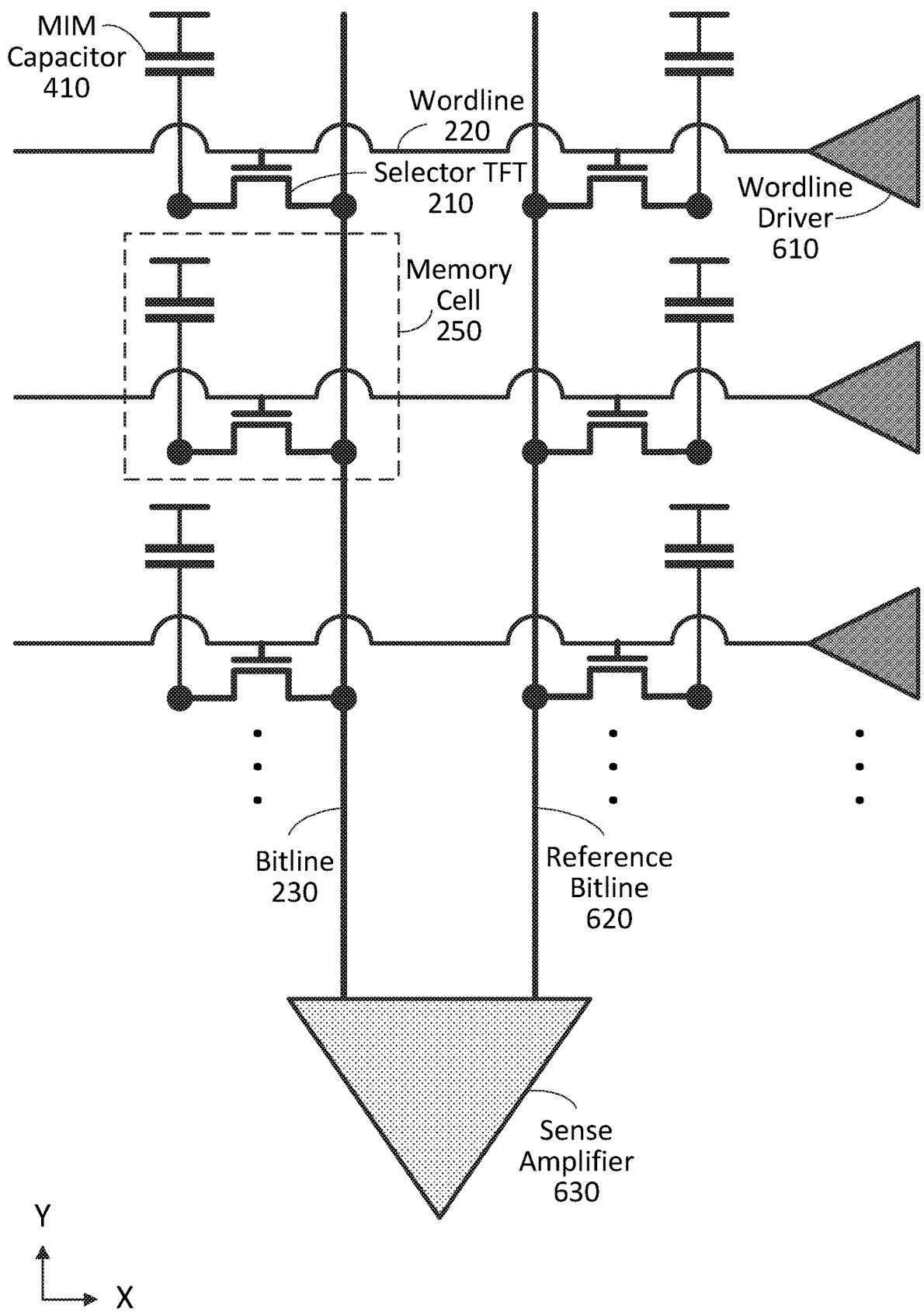
FIG. 6 is a schematic plan view of an example TFT-eDRAM memory array configuration, according to an embodiment of the present disclosure.

FIG. 6 is a schematic plan (X-Y) view of an example TFT-eDRAM memory array configuration according to an embodiment of the present disclosure. The memory array configuration of FIG. 6 includes memory cells 250 at crossing regions of wordlines 220 and bitlines 230 (e.g., each memory cell 250 being driven by a unique pair of wordline 220 and bitline 230), each memory cell 250 including a selector TFT 210 and a MIM capacitor 410. Each wordline is selected by a corresponding wordline driver 610, while the corresponding bitlines 230 are precharged to a set or predetermined voltage, and then sense the charge in the MIM capacitor 410 of each of the corresponding bits of the selected wordline 220. In addition, a reference column of memory cells provides a corresponding reference signal (e.g., halfway between a logic low value and a logic high value) over a reference bitline 620 concurrently with the sensing of the desired bit on the bitline 230. These two values are compared, by a sense amplifier 630, which determines whether the desired bit is a logic high value (e.g., 1) or a logic low value (e.g., 0).

The memory cells 250 are embedded in BEOL layers (such as the higher metal interconnect layers of the BEOL) while the peripheral circuits responsible for memory operation, including the read sense amplifiers 630 (and other bitline driver circuits) and wordline driver circuits 610, are placed below the memory array (e.g., in the FEOL and lower metal interconnect layers of the BEOL) to reduce area of the memory macro array.

FIG. 7A is a plan (Y-X) view of an example layout of a TFT-eDRAM without overlap of the memory array 190 and memory peripheral circuit (illustrated as wordline drivers 610 and column circuits 710). FIGS. 7B-7C are plan (Y-X) views of an example layout or floorplan of a TFT-eDRAM with overlap of the memory array 190 and memory peripheral circuits 610 and 710 according to an embodiment of the present disclosure.

The column circuits 710 (or bitline drivers) include devices such as read (bitline) sense amplifiers 630 and precharging circuits. FIG. 7A shows the circuits spread out (e.g., occupying FEOL macro area or CMOS logic transistor area) and without overlap. By contrast, FIG. 7B shows the memory array 190 occupying the higher metal interconnection layers of the BEOL 120 (as illustrated in FIGS. 1-5) and FIG. 7C shows the memory peripheral circuits 610 and 710 occupying the FEOL 110 and lower metal interconnection layers of the BEOL 120 underneath the memory array 190 (as illustrated in FIG. 1). Since more than 35% of the eDRAM memory macro area can be consumed by the peripheral (memory control) circuits, substantial savings of X-Y macro area can be saved by fabricating the memory arrays above the memory peripheral circuits, as in one or more embodiments of the present disclosure. Put another way, according to some embodiments of the present disclosure, a TFT-eDRAM is provided with memory cells only using space in the upper metal layers (e.g., metal 4 layer and above), the peripheral circuits being moved below the memory cells (e.g., in metal 3 layer and below, including the FEOL) and substantially reduce the memory area.

Figure 8:
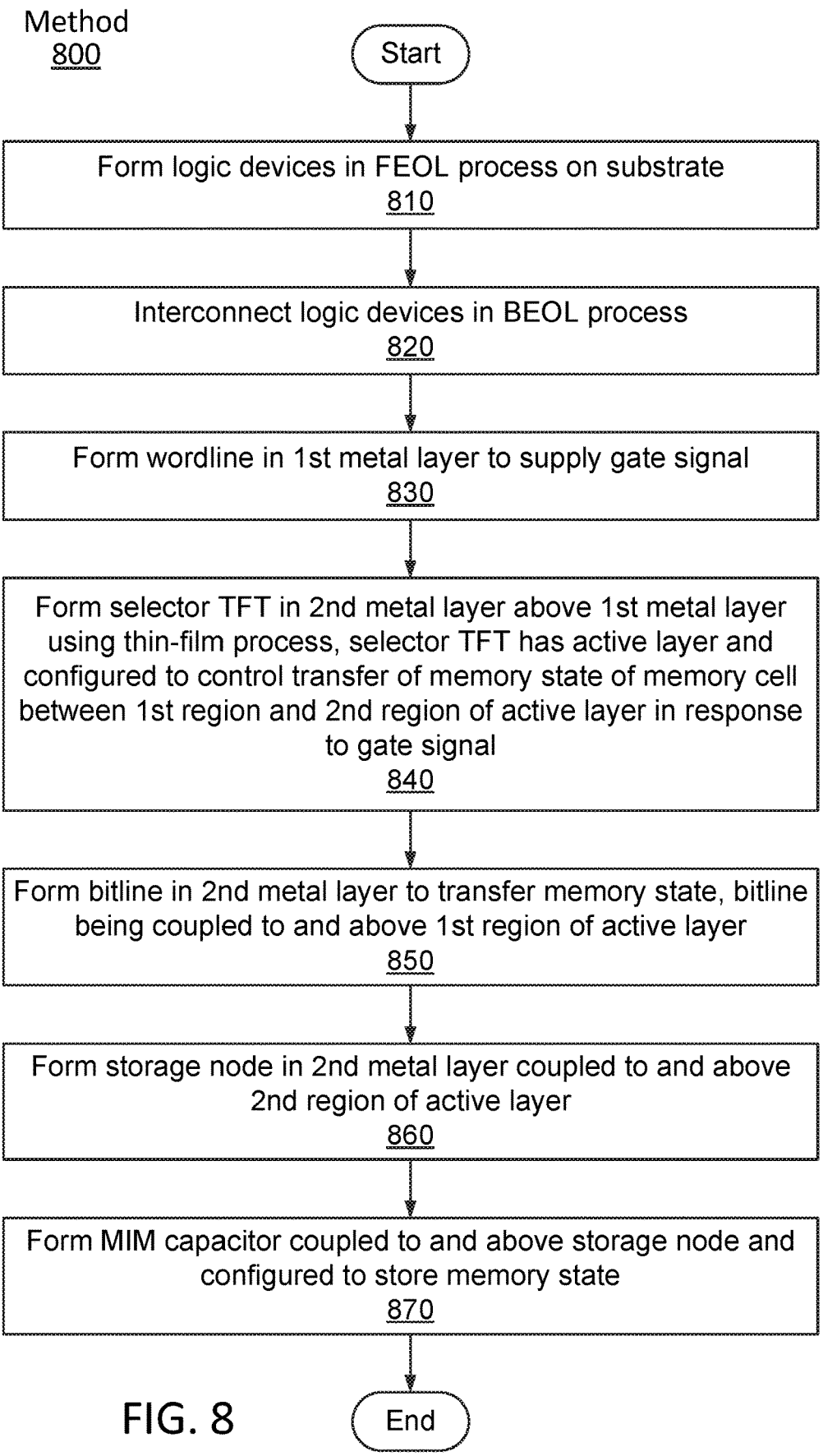
FIG. 8 illustrates an example method of forming an eDRAM memory cell, according to an embodiment of the present disclosure.
Figure 9:
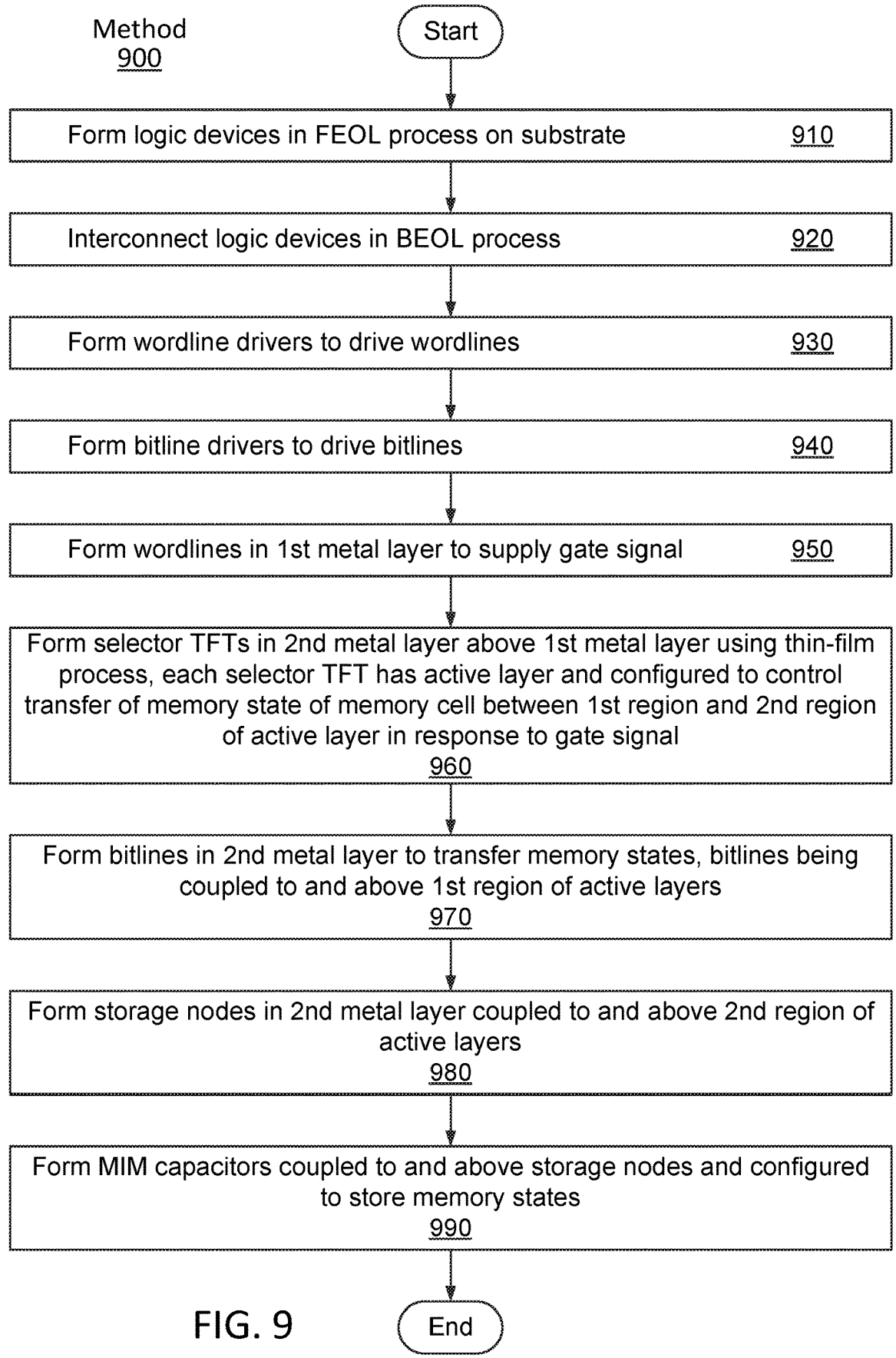
FIG. 9 illustrates an example method of forming an eDRAM including memory cells at crossing regions of wordlines and bitlines, according to an embodiment of the present disclosure.

FIG. 8 illustrates an example method 800 of forming an eDRAM memory cell, according to an embodiment of the present disclosure. FIG. 9 illustrates an example method 900 of forming an eDRAM including memory cells at crossing regions of wordlines and bitlines, according to an embodiment of the present disclosure. These and other methods disclosed herein may be carried out using integrated circuit fabrication techniques such as photolithography as would be apparent in light of the present disclosure. The corresponding eDRAM memory cell and eDRAM including the memory cells may be part of other (logic) devices on the same substrate, such as application specific integrated circuits (ASICs), microprocessors, central processing units, processing cores, and the like. Unless otherwise described herein, verbs such as "coupled" or "couple" refer to an electrical coupling (such as capable of transmitting an electrical signal), either directly or indirectly (such as through one or more conductive layers in between).

Referring to FIGS. 8-9 (with specific example references to the structures of FIGS. 1-7) method 800 includes forming 810 logic devices (e.g., transistors, capacitors, resistors, and the like, such as FEOL 110) in a front end of line (FEOL) process on a substrate, and interconnecting 820 the logic devices in a back end of line (BEOL) process, such as BEOL 120. The BEOL process includes forming 830 a wordline (such as wordline 220) in a first metal layer (such as metal 4 layer 140) to supply a gate signal, and forming 840 a selector thin-film transistor (TFT, such as selector TFT 210) in a second metal layer (such as metal 5 layer 145) above the first metal layer using a thin-film process. The selector TFT has an active layer (such as active layer 218) and is configured to control transfer (such as through a channel region) of a memory state (such as low logic or high logic, 0 or 1) of the memory cell (such as memory cell 250) between a first region (such as a drain region coupled to bitline 230) and a second region (such as a source region coupled to storage node 240) of the active layer in response to the gate signal (such as the gate signal being delivered to a metal gate 214). The BEOL process further includes forming 850 a bitline (such as bitline 230) in the second metal layer to transfer the memory state. The bitline is coupled to and above the first region of the active layer. The BEOL process further includes forming 860 a storage node (such as storage node 240) in the second metal layer coupled to and above the second region of the active layer, and forming 870 a metal-insulator-metal (MIM) capacitor (such as MIM capacitor 410) coupled to and above the storage node and configured to store the memory state.

Method 900 includes forming 910 logic devices in an FEOL process on a substrate, and interconnecting 920 the logic devices in a BEOL process. The BEOL process includes a first part (such as metal 1 layer 125 through metal 3 layer 135) and a second part (such as metal 4 layer 140 through metal 7 layer 165) following the first part. The FEOL process and the first part of the BEOL process include forming 930 wordline drivers (such as wordline drivers 610) to drive the wordlines (such as wordlines 220) and forming 940 bitline drivers (such as sense amplifiers 630 and column circuits 710) to drive the bitlines (such as bitlines 230). The second part of the BEOL process includes forming 950 the wordlines in a first metal layer (such as metal 4 layer 140) to supply a gate signal and, for each memory cell (such as memory cell 250), forming 960 a selector TFT (such as selector TFT 210) in a second metal layer (such as metal 5 layer 145) above the first metal layer using a thin film process. The selector TFT has an active layer (such as active layer 218) and is configured to control transfer of a memory state of the memory cell between a first region and a second region of the active layer in response to the gate signal being supplied by a corresponding one of the wordlines. The second part of the BEOL process further includes forming 970 the bitlines in the second metal layer to transfer the memory state of each of the memory cells. The first region of the active layer of the selector TFT of each memory cell is coupled to and below a corresponding one of the bitlines. The second part of the BEOL process further includes, for each memory cell, forming 980 a storage node (such as storage node 240) in the second metal layer and coupled to and above the second region of the active layer of the selector TFT, and forming 990 a metal-insulator-metal (MIM) capacitor (such as MIM capacitor 410) coupled to and above the storage node and configured to store the memory state.

Example System

Figure 10:
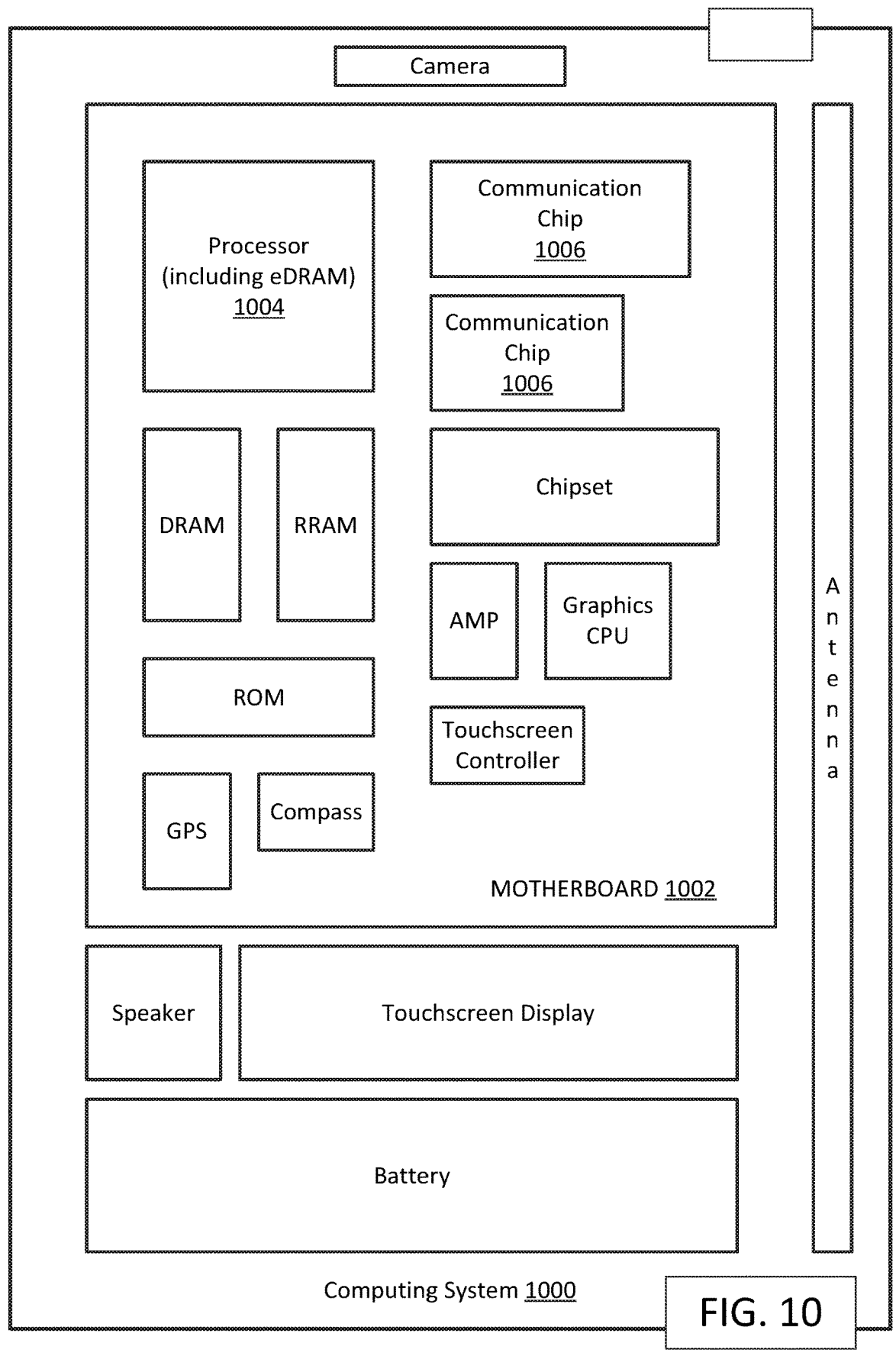
FIG. 10 illustrates an example computing system implemented with the integrated circuit structures or techniques disclosed herein, according to an embodiment of the present disclosure.

FIG. 10 illustrates a computing system 1000 implemented with the integrated circuit structures or techniques disclosed herein, according to an embodiment of the present disclosure. As can be seen, the computing system 1000 houses a motherboard 1002. The motherboard 1002 may include a number of components, including, but not limited to, a processor 1004 (including eDRAM) and at least one communication chip 1006, each of which can be physically and electrically coupled to the motherboard 1002, or otherwise integrated therein. As will be appreciated, the motherboard 1002 may be, for example, any printed circuit board, whether a main board, a daughterboard mounted on a main board, or the only board of system 1000, to name a few examples.

Depending on its applications, computing system 1000 may include one or more other components that may or may not be physically and electrically coupled to the motherboard 1002. These other components may include, but are not limited to, volatile memory (e.g., DRAM), non-volatile memory (e.g., read-only memory (ROM), resistive random-access memory (RRAM), and the like), a graphics processor, a digital signal processor, a crypto (or cryptographic) processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1000 may include one or more integrated circuit structures or devices (e.g., one or more eDRAM memory cells) formed using the disclosed techniques in accordance with an example embodiment. In some embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing system 1000. The term "wireless" and its derivatives may be used to describe circuits, devices, systems, methods, techniques, communications channels, and the like, that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing system 1000 includes an integrated circuit die packaged within the processor 1004. In some embodiments, the integrated circuit die of the processor includes onboard circuitry that is implemented with one or more integrated circuit structures or devices (e.g., one or more eDRAM memory cells) formed using the disclosed techniques, as variously described herein. The term "processor" may refer to any device or portion of a device that processes, for instance, electronic data from registers and/or memory to transform that electronic data into other electronic data that may be stored in registers and/or memory.

The communication chip 1006 also may include an integrated circuit die packaged within the communication chip 1006. In accordance with some such example embodiments, the integrated circuit die of the communication chip includes one or more integrated circuit structures or devices (e.g., one or more eDRAM memory cells) formed using the disclosed techniques as variously described herein. As will be appreciated in light of this disclosure, note that multi-standard wireless capability may be integrated directly into the processor 1004 (e.g., where functionality of any chips 1006 is integrated into processor 1004, rather than having separate communication chips). Further note that processor 1004 may be a chip set having such wireless capability. In short, any number of processor 1004 and/or communication chips 1006 can be used. Likewise, any one chip or chip set can have multiple functions integrated therein.

In various implementations, the computing device 1000 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device that processes data or employs one or more integrated circuit structures or devices (e.g., one or more eDRAM memory cells) formed using the disclosed techniques, as variously described herein.

Further Example Embodiments

The following examples pertain to further embodiments, from which numerous permutations and configurations will be apparent.

Example 1 is an embedded dynamic random-access memory (eDRAM) memory cell. The memory cell includes: a wordline to supply a gate signal; a selector thin-film transistor (TFT) including an active layer and configured to control transfer of a memory state of the memory cell between a first region and a second region of the active layer in response to the gate signal, the selector TFT being above the wordline; a bitline to transfer the memory state and coupled to and above the first region of the active layer; a storage node coupled to and above the second region of the active layer; and a metal-insulator-metal (MIM) capacitor coupled to and above the storage node and configured to store the memory state.

Example 2 includes the subject matter of Example 1, where the active layer includes indium gallium zinc oxide (IGZO).

Example 3 includes the subject matter of any of Examples 1-2, where the selector TFT further includes a gate layer coupled to the wordline and below the active layer, and a gate dielectric layer to insulate the gate layer from the active layer.

Example 4 includes the subject matter of Example 3, where the selector TFT further includes a diffusion barrier layer coupled to and between the wordline and the gate layer.

Example 5 includes the subject matter of Example 4, where the diffusion barrier layer includes tantalum (Ta) and nitrogen (N). For example, in one embodiment, the diffusion barrier layer is TaN. In another embodiment, the diffusion barrier layer is a stack of TaN on Ta.

Example 6 includes the subject matter of any of Examples 1-5, where the MIM capacitor includes a bottom electrode coupled to the storage node, a top electrode coupled to a MIM capacitor plate, and a dielectric to insulate the bottom electrode from the top electrode.

Example 7 includes the subject matter of any of Examples 1-6, where the wordline is in a first metal layer, the bitline is in an interconnect portion of a second metal layer above the first metal layer, and the selector TFT is in a via portion of the second metal layer below the interconnect portion, the via portion for coupling metal structures of the interconnect portion to metal structures of the first metal layer.

Example 8 includes the subject matter of any of Examples 1-6, where the storage node is in a first metal layer, and the MIM capacitor is in a second metal layer above the first metal layer and in a via portion of a third metal layer above the second metal layer, the via portion for coupling metal structures of an interconnect portion of the third metal layer above the via portion to metal structures of the second metal layer.

Example 9 is an embedded dynamic random-access memory (eDRAM). The eDRAM includes: wordlines to supply a gate signal; wordline drivers to drive the wordlines, the wordline drivers being below the wordlines; bitlines to transfer memory data and located above the wordlines; bitline drivers to drive the bitlines, the bitline drivers being below the wordlines; and memory cells at crossing regions of the wordlines and the bitlines. Each memory cell includes a selector thin-film transistor (TFT) having an active layer and configured to control transfer of a memory state of the memory cell between a first region and a second region of the active layer in response to the gate signal being supplied by a corresponding one of the wordlines below the selector TFT, the first region of the active layer being coupled to and below a corresponding one of the bitlines, a storage node coupled to and above the second region of the active layer, and a metal-insulator-metal (MIM) capacitor coupled to and above the storage node and configured to store the memory state.

Example 10 includes the subject matter of Example 9, where the active layer includes indium gallium zinc oxide (IGZO).

Example 11 includes the subject matter of any of Examples 9-10, where the selector TFT further has a gate layer coupled to the corresponding one of the wordlines and below the active layer, and a gate dielectric layer to insulate the gate layer from the active layer.

Example 12 includes the subject matter of Example 11, where the selector TFT further has a diffusion barrier layer coupled to and between the corresponding one of the wordlines and the gate layer. For example, in one embodiment, the diffusion barrier layer has high conductivity. In addition, in some embodiments, the wordline includes copper (Cu) and the diffusion barrier layer is a copper-diffusion barrier layer.

Example 13 includes the subject matter of Example 12, where the diffusion barrier layer includes tantalum (Ta) and nitrogen (N).

Example 14 includes the subject matter of any of Examples 9-13, where the MIM capacitor includes a bottom electrode coupled to the storage node, a top electrode coupled to a MIM capacitor plate, and a dielectric to insulate the bottom electrode from the top electrode.

Example 15 includes the subject matter of any of Examples 9-14, where the wordlines are in a first metal layer, the bitlines are in an interconnect portion of a second metal layer of the above the first metal layer, and the selector TFT is in a via portion of the second metal layer below the interconnect portion, the via portion for coupling metal structures of the interconnect portion to metal structures of the first metal layer.

Example 16 includes the subject matter of any of Examples 9-14, where the storage node is in a first metal layer, and the MIM capacitor is in a second metal layer above the first metal layer and in a via portion of a third metal layer above the second metal layer, the via portion for coupling metal structures of an interconnect portion of the third metal layer above the via portion to metal structures of the second metal layer.

Example 17 includes the subject matter of Example 16, where the MIM capacitor includes a bottom electrode coupled to the storage node, a top electrode coupled to a MIM capacitor plate, and a dielectric to insulate the bottom electrode from the top electrode, the eDRAM further includes the MIM capacitor plate, and the MIM capacitor plate is in the via portion and coupled to the top electrode of the MIM capacitor of each of several of the memory cells.

Example 18 includes the subject matter of Example 17, further including a common voltage line in the interconnect portion to supply a common voltage to the MIM capacitor plate.

Example 19 is a method of forming an embedded dynamic random-access memory (eDRAM) memory cell. The method includes: forming logic devices in a front end of line (FEOL) process on a substrate; and interconnecting the logic devices in a back end of line (BEOL) process. The BEOL process includes forming a wordline in a first metal layer to supply a gate signal, forming a selector thin-film transistor (TFT) in a second metal layer above the first metal layer using a thin-film process, the selector TFT having an active layer and configured to control transfer of a memory state of the memory cell between a first region and a second region of the active layer in response to the gate signal, forming a bitline in the second metal layer to transfer the memory state, the bitline being coupled to and above the first region of the active layer, forming a storage node in the second metal layer coupled to and above the second region of the active layer, and forming a metal-insulator-metal (MIM) capacitor coupled to and above the storage node and configured to store the memory state.

Example 20 includes the subject matter of Example 19, where the forming of the selector TFT includes forming the active layer using indium gallium zinc oxide (IGZO).

Example 21 includes the subject matter of any of Examples 19-20, where the forming of the selector TFT includes forming a gate layer coupled to the wordline and below the active layer, and forming a gate dielectric layer to insulate the gate layer from the active layer.

Example 22 includes the subject matter of Example 21, where the forming of the selector TFT further includes forming a diffusion barrier layer coupled to and between the wordline and the gate layer.

Example 23 includes the subject matter of Example 22, where the forming of the diffusion barrier layer includes forming the diffusion barrier layer using tantalum (Ta) and nitrogen (N).

Example 24 includes the subject matter of any of Examples 19-23, where the forming of the MIM capacitor includes forming a bottom electrode coupled to the storage node, forming a dielectric on the bottom electrode, and forming a top electrode on the dielectric and coupled to a MIM capacitor plate, the dielectric insulating the bottom electrode from the top electrode.

Example 25 includes the subject matter of any of Examples 19-24, where the forming of the bitline includes forming the bitline in an interconnect portion of the second metal layer, and the forming of the selector TFT includes forming the selector TFT in a via portion of the second metal layer below the interconnect portion, the via portion for coupling metal structures of the interconnect portion to metal structures of the first metal layer.

Example 26 includes the subject matter of any of Examples 19-24, where the forming of the MIM capacitor includes forming the MIM capacitor in a third metal layer above the second metal layer and in a via portion of a fourth metal layer above the third metal layer, the via portion for coupling metal structures of an interconnect portion of the fourth metal layer above the via portion to metal structures of the third metal layer.

Example 27 is a method of forming an embedded dynamic random-access memory (eDRAM) including memory cells at crossing regions of wordlines and bitlines. The method includes: forming logic devices in a front end of line (FEOL) process on a substrate; and interconnecting the logic devices in a back end of line (BEOL) process, the BEOL process including a first part and a second part following the first part. The FEOL process and the first part of the BEOL process include forming wordline drivers to drive the wordlines, and forming bitline drivers to drive the bitlines. The second part of the BEOL process includes forming the wordlines in a first metal layer to supply a gate signal, for each memory cell, forming a selector thin-film transistor (TFT) in a second metal layer above the first metal layer using a thin film process, the selector TFT having an active layer and configured to control transfer of a memory state of the memory cell between a first region and a second region of the active layer in response to the gate signal being supplied by a corresponding one of the wordlines, forming the bitlines in the second metal layer to transfer the memory state of each of the memory cells, the first region of the active layer of the selector TFT of each memory cell being coupled to and below a corresponding one of the bitlines, for each memory cell, forming a storage node in the second metal layer and coupled to and above the second region of the active layer of the selector TFT, and for each memory cell, forming a metal-insulator-metal (MIM) capacitor coupled to and above the storage node and configured to store the memory state.

Example 28 includes the subject matter of Example 27, where the forming of the selector TFT includes forming the active layer using indium gallium zinc oxide (IGZO).

Example 29 includes the subject matter of any of Examples 27-28, where the forming of the selector TFT includes forming a gate layer coupled to the corresponding one of the wordlines and below the active layer, and forming a gate dielectric layer to insulate the gate layer from the active layer.

Example 30 includes the subject matter of Example 29, where the forming of the selector TFT further includes forming a diffusion barrier layer coupled to and between the corresponding one of the wordlines and the gate layer.

Example 31 includes the subject matter of Example 30, where the forming of the diffusion barrier layer includes forming the diffusion barrier layer using tantalum (Ta) and nitrogen (N).

Example 32 includes the subject matter of any of Examples 27-31, where the forming of the MIM capacitor includes forming a bottom electrode coupled to the storage node, forming a dielectric on the bottom electrode, and forming a top electrode on the dielectric and coupled to a MIM capacitor plate, the dielectric insulating the bottom electrode from the top electrode.

Example 33 includes the subject matter of any of Examples 27-32, where the forming of the bitlines includes forming the bitlines in an interconnect portion of the second metal layer, and the forming of the selector TFT includes forming the selector TFT in a via portion of the second metal layer below the interconnect portion, the via portion for coupling metal structures of the interconnect portion to metal structures of the first metal layer.

Example 34 includes the subject matter of any of Examples 27-32, where the forming of the MIM capacitor includes forming the MIM capacitor in a third metal layer above the second metal layer and in a via portion of a fourth metal layer above the third metal layer, the via portion for coupling metal structures of an interconnect portion of the fourth metal layer above the via portion to metal structures of the third metal layer.

Example 35 includes the subject matter of Example 34, where the forming of the MIM capacitor further includes forming a bottom electrode coupled to the storage node, forming a dielectric on the bottom electrode, and forming a top electrode on the dielectric and coupled to a MIM capacitor plate, the dielectric insulating the bottom electrode from the top electrode, and the method further includes forming the MIM capacitor plate in the via portion and coupled to the top electrode of the MIM capacitor of each of several of the memory cells.

Example 36 includes the subject matter of Example 35, further including forming a common voltage line in the interconnect portion to supply a common voltage to the MIM capacitor plate.

The foregoing description of example embodiments has been presented for the purposes of illustration and description. It is not intended to be exhaustive or to limit the present disclosure to the precise forms disclosed. Many modifications and variations are possible in light of this disclosure. It is intended that the scope of the present disclosure be limited not by this detailed description, but rather by the claims appended hereto. Future filed applications claiming priority to this application may claim the disclosed subject matter in a different manner, and may generally include any set of one or more limitations as variously disclosed or otherwise demonstrated herein.

What is claimed is:

1. An integrated circuit including an embedded dynamic random-access memory (eDRAM) memory cell, the integrated circuit comprising:
    a device layer including a plurality of transistors; and
    an interconnect structure above the device layer and including one or more additional layers each comprising dielectric material, the interconnect structure further comprising
        a selector thin-film transistor (TFT) including an active material layer having an upper surface having a first region and a second region,
        a wordline coupled to and below the active material layer,
        a bitline coupled to and above the first region of the active material layer,
        a storage node coupled to and above the second region of the active material layer, the storage node laterally separated from the bitline along the upper surface of the active material layer, and
        a metal-insulator-metal (MIM) capacitor coupled to and above the storage node, wherein the MIM capacitor is separate and distinct from the storage node, and wherein the storage node is vertically between the MIM capacitor and the upper surface of the active material layer.

2. The integrated circuit of claim 1, wherein the active material layer comprises indium, gallium, zinc, and oxygen.

3. The integrated circuit of claim 1, wherein the selector TFT further includes: a gate electrode coupled to the wordline and below the active material layer; and a gate dielectric layer between the gate electrode and the active material layer.

4. The integrated circuit of claim 3, wherein the selector TFT further includes a diffusion barrier between the wordline and the gate electrode.

5. The integrated circuit of claim 4, wherein the diffusion barrier layer comprises tantalum (Ta) and nitrogen (N).

6. The integrated circuit of claim 1, wherein the MIM capacitor comprises a bottom electrode, a top electrode, and a dielectric between the bottom electrode from the top electrode, wherein the bottom electrode is coupled to the storage node, and the top electrode is coupled to a conductive interconnect above the MIM capacitor.

7. The integrated circuit of claim 1, wherein
the wordline is at least partly in a first layer of the interconnect structure,
the bitline is at least partly in a second layer of the interconnect structure, the second layer above the first layer, and
the selector TFT is at least partly in the second layer.

8. The integrated circuit of claim 7, wherein
the storage node is at least partly in the second layer, and
the MIM capacitor is at least partly in a third layer of the interconnect structure, the third layer above the second layer.

9. An integrated circuit including an embedded dynamic random-access memory (eDRAM), the integrated circuit comprising:
wordlines to supply a gate signal;
wordline drivers to drive the wordlines, the wordline drivers being below the wordlines;
bitlines to transfer memory data and located above the wordlines;
bitline drivers to drive the bitlines, the bitline drivers being below the wordlines; and
memory cells at crossing regions of the wordlines and the bitlines, each memory cell including
a selector thin-film transistor (TFT) having an active material layer and configured to control transfer of a memory state of the memory cell between a first region and a second region of an upper surface of the active material layer in response to the gate signal being supplied by a corresponding one of the wordlines below the selector TFT, the first region of the active material layer being coupled to and below a corresponding one of the bitlines,
a storage node coupled to and above the second region of the active material layer, the storage node laterally separated from the corresponding one of the bitlines along the upper surface of the active material layer, and
a metal-insulator-metal (MIM) capacitor coupled to and above the storage node and configured to store the memory state, wherein the MIM capacitor is separate and distinct from the storage node, and wherein the storage node is vertically between the MIM capacitor and the upper surface of the active material layer.

10. The integrated circuit of claim 9, wherein the active material layer comprises indium gallium zinc oxide (IGZO).

11. The integrated circuit of claim 9, wherein the selector TFT further has a gate electrode coupled to the corresponding one of the wordlines and below the active material layer, and a gate dielectric layer to insulate the gate electrode from the active material layer.

12. The integrated circuit of claim 11, wherein the selector TFT further has a diffusion barrier layer coupled to and between the corresponding one of the wordlines and the gate electrode.

13. The integrated circuit of claim 12, wherein the diffusion barrier layer comprises tantalum (Ta) and nitrogen (N).

14. The integrated circuit of claim 9, wherein the MIM capacitor comprises a bottom electrode coupled to the storage node, a top electrode coupled to a MIM capacitor plate, and a dielectric to insulate the bottom electrode from the top electrode.

15. The integrated circuit of claim 9, wherein
the wordlines are in a first metal layer,
the bitlines are in an interconnect portion of a second metal layer above the first metal layer, and
the selector TFT is in a via portion of the second metal layer below the interconnect portion, the via portion for coupling metal structures of the interconnect portion to metal structures of the first metal layer.

16. The integrated circuit of claim 9, wherein
the storage node is in a first metal layer, and
the MIM capacitor is in a second metal layer above the first metal layer and in a via portion of a third metal layer above the second metal layer, the via portion for coupling metal structures of an interconnect portion of the third metal layer above the via portion to metal structures of the second metal layer.

17. The integrated circuit of claim 16, wherein
the MIM capacitor comprises a bottom electrode coupled to the storage node, a top electrode coupled to a MIM capacitor plate, and a dielectric to insulate the bottom electrode from the top electrode,
the eDRAM further comprises the MIM capacitor plate, and
the MIM capacitor plate is in the via portion and coupled to the top electrode of the MIM capacitor of each of several of the memory cells.

18. The integrated circuit of claim 17, further comprising a common voltage line in the interconnect portion to supply a common voltage to the MIM capacitor plate.

19. A method of forming an integrated circuit including an embedded dynamic random-access memory (eDRAM) memory cell, the method comprising:
forming transistor devices in a front end of line (FEOL) process on a substrate; and
forming an interconnect structure above the transistor devices and in a back end of line (BEOL) process, the BEOL process including
forming a wordline in a first metal layer to supply a gate signal,
forming a selector thin-film transistor (TFT) in a second metal layer above the first metal layer using a thin-film process, the selector TFT having an active material layer and configured to control transfer of a memory state of the memory cell between a first region and a second region of an upper surface of the active material layer in response to the gate signal,
forming a bitline in the second metal layer to transfer the memory state, the bitline being coupled to and above the first region of the active material layer,
forming a storage node in the second metal layer coupled to and above the second region of the active material layer, the storage node laterally separated from the bitline along the upper surface of the active material layer, and
forming a metal-insulator-metal (MIM) capacitor coupled to and above the storage node and configured to store the memory state, wherein the MIM capacitor is separate and distinct from the storage node, and wherein the storage node is vertically between the MIM capacitor and the upper surface of the active material layer.

20. The method of claim 19, wherein the forming of the MIM capacitor comprises forming the MIM capacitor in a third metal layer above the second metal layer.

* * * * *